(12) United States Patent
Baranyai

(10) Patent No.: US 10,509,431 B2
(45) Date of Patent: Dec. 17, 2019

(54) REVERSIBLE CURRENT MIRROR AND ITS USE IN BIDIRECTIONAL COMMUNICATION

(71) Applicants: THYSSENKRUPP PRESTA AG, Eschen (LI); thyssenkrupp AG, Essen (DE)

(72) Inventor: Zoltán Baranyai, Herceghalom (HU)

(73) Assignees: THYSSENKRUPP PRESTA AG, Eschen (LI); THYSSENKRUPP AG, Essen (DE)

( * ) Notice: Subject to any disclaimer, the term of this patent is extended or adjusted under 35 U.S.C. 154(b) by 53 days.

(21) Appl. No.: 15/573,142

(22) PCT Filed: May 12, 2015

(86) PCT No.: PCT/EP2015/060439
§ 371 (c)(1),
(2) Date: Nov. 10, 2017

(87) PCT Pub. No.: WO2016/180479
PCT Pub. Date: Nov. 17, 2016

(65) Prior Publication Data
US 2018/0129238 A1    May 10, 2018

(51) Int. Cl.
*G05F 3/26* (2006.01)
*B62D 5/04* (2006.01)
(Continued)

(52) U.S. Cl.
CPC ............ *G05F 3/26* (2013.01); *B62D 5/0463* (2013.01); *H02P 9/06* (2013.01); *G04G 3/02* (2013.01)

(58) Field of Classification Search
CPC ... G05F 3/26; H02P 9/06; H02P 27/06; B62D 5/0463; H03K 19/018507; G04G 3/02
(Continued)

(56) References Cited

U.S. PATENT DOCUMENTS 3,617,778 A  *  11/1971  Korom ................. G04G 3/02
                                                            327/540
5,006,734 A      4/1991  Engelbrecht
(Continued)

FOREIGN PATENT DOCUMENTS

CN    101989940 A    3/2011
CN    102739384 A    10/2012
(Continued)

OTHER PUBLICATIONS

English Translation of International Search Report issued in PCT/EP2015/060439, dated Jan. 28, 2016 (dated Feb. 5, 2016).

*Primary Examiner* — Bickey Dhakal
*Assistant Examiner* — Zemenay T Truneh
(74) *Attorney, Agent, or Firm* — thyssenkrupp North America, Inc.

(57) ABSTRACT

A current mirror arrangement for duplex bidirectional communication between two circuit units may include in each circuit unit two identical transistors with their bases (36, 37) connected together and their bases and their collectors connected to each other respectively. Further, each of the connections between the bases and the collectors may be formed via a MOSFET. The MOSFETs of both circuit units may be connected together. More specifically, the MOSFETs' parasitic diodes of each circuit unit may be arranged in opposite directions with respect to the current system. The pair of MOSFETs in a first of the two circuit units may comprise n-channel enhancement-mode MOSFETs, and the pair of MOSFETs in a second of the two circuit units may comprise p-channel enhancement-mode MOSFETs.

15 Claims, 4 Drawing Sheets

(51) Int. Cl.
*H02P 9/06* (2006.01)
*G04G 3/02* (2006.01)

(58) Field of Classification Search
USPC .............................. 318/9; 323/282; 327/540
See application file for complete search history.

(56) References Cited

U.S. PATENT DOCUMENTS

| | | | | |
|---|---|---|---|---|
| 5,585,701 A | * | 12/1996 | Kaida | G01R 19/0092 |
| | | | | 318/400.27 |
| 2012/0286753 A1 | * | 11/2012 | Zhong | G05F 3/26 |
| | | | | 323/282 |
| 2014/0055059 A1 | * | 2/2014 | Uryu | H02P 27/06 |
| | | | | 318/9 |
| 2015/0056935 A1 | | 2/2015 | Komori | |

FOREIGN PATENT DOCUMENTS

| | | | | | |
|---|---|---|---|---|---|
| CN | 103235633 A | | 8/2013 | | |
| EP | 2187518 A | | 5/2010 | | |
| JP | 2015033268 | * | 2/2015 | .......... | H02P 29/0243 |

\* cited by examiner

REVERSIBLE CURRENT MIRROR AND ITS USE IN BIDIRECTIONAL COMMUNICATION

CROSS REFERENCE TO RELATED APPLICATION

This application is a U.S. National Stage Entry of International Patent Application Serial Number PCT/EP2015/060439, filed May 12, 2015, the entire content of which is incorporated herein by reference.

FIELD

The present disclosure generally relates to current mirrors, including current mirrors for use in bidirectional communication between two circuits.

BACKGROUND

Electromechanical steering mechanisms usually have an electric motor as servomotor. Servomotors of this design are actuated by a control unit via a set of MOSFETs, wherein with three phase windings six MOSFETs are provided in total. Each MOSFET switches the assigned phase winding to the on-board vehicle power-supply voltage or the earth potential. This occurs at a high frequency so that the temporal average value acts as the effective voltage in the phase windings. For safety reasons it is known to separate the phase lines in the neutral point of the motor. Separation takes place in a motor control unit (MCU) which is controlled with appropriate information from an electronic control unit (ECU). Signal lines are used to transfer this information and measured signals, for example angle of rotation of the motor measured by a rotor position sensor (RPS), between MCU and ECU. Thereby a separate line is required for each signal direction. Each signal line requires at each end a contact for signal transmission. These contacts are, however, error-prone because of the applied low voltages.

Thus a need exists for a simple and cost effective solution for transmission of electrical signals, where two-sided communication can be realized with less contacts and wires.

DETAILED DESCRIPTION

Figure 1:
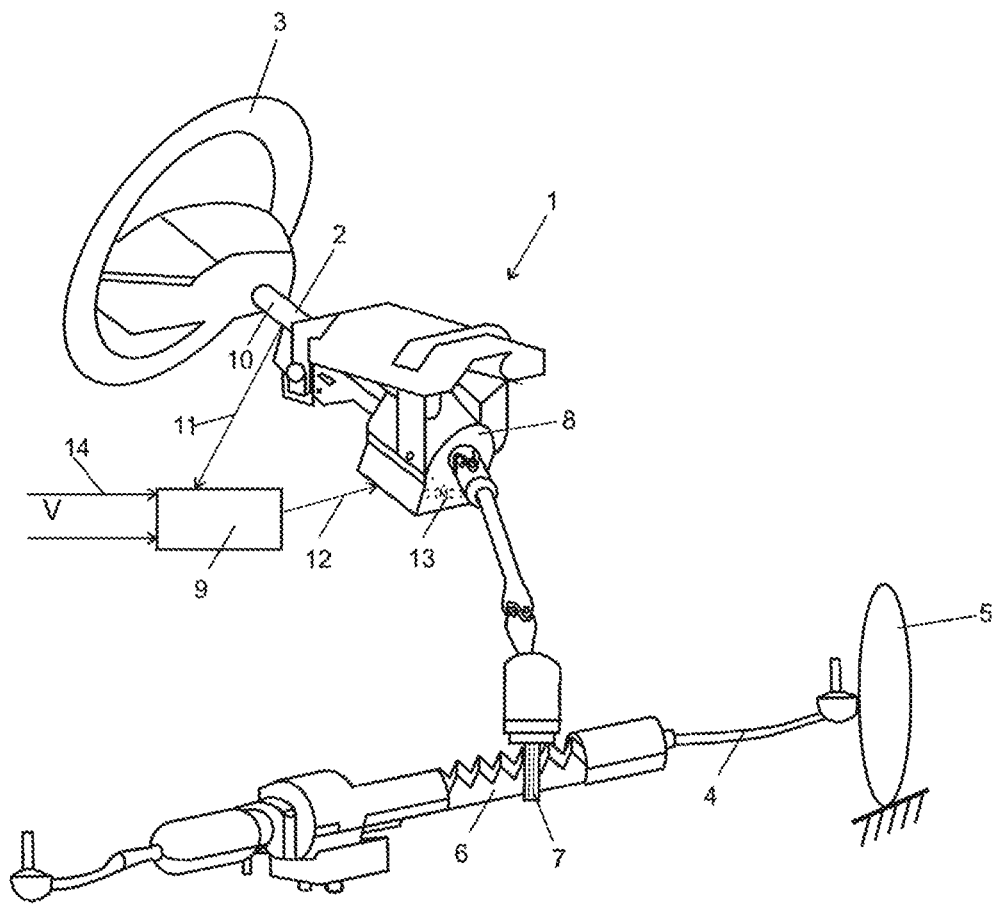
FIG. 1 is a schematic view of a prior art electromechanical power steering mechanism.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting 'a' element or 'an' element in the appended claims does not restrict those claims to articles, apparatuses, systems, methods, or the like having only one of that element, even where other elements in the same claim or different claims are preceded by 'at least one' or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

Accordingly, a current mirror arrangement for bidirectional communication between two circuit units is provided, said arrangement comprising, in each circuit unit, a pair of first identical transistors with their bases connected together and their bases and their collectors connected to each other respectively, wherein each of the connections between the bases and the collectors is formed via a pair of second transistors, and the pair of second transistors of both circuit units are connected together, wherein the parasitic diodes of the pair of second transistors of each circuit unit are arranged in opposite directions.

The current mirrors are reversed by using additional transistors to change circuit topology by controllably reconfiguring the direction of the mirror. This makes possible a bidirectional communication with only one contact at each end.

In a preferred embodiment in each circuit unit a pair of MOSFETs are arranged.

In a further preferred embodiment the MOSFETs of one circuit unit are n-channel enhancement-mode MOSFETs and the MOSFETs of the other circuit unit are p-channel enhancement-mode MOSFETs.

It is further advantageous if the emitters of the two transistors of one circuit unit are connected to the ground and the emitters of the two transistors of the other circuit unit are connected to a power line.

Preferably, the two transistors with their emitters connected to the ground are npn-transistors and the transistors of the other circuit unit are pnp-transistors.

Accordingly, an electromechanical motor vehicle power steering mechanism is provided, having an electric motor including at least three phase windings connected to each other in a Y connection; an electric controller electronically coupled to a motor control unit of the electric motor; positive and negative feed lines from direct current voltage motor vehicle electrical system and electronically coupled to the electronic controller; a driver circuit coupled via respective connecting lines to the at least three phase windings of the electric motor, wherein the driver circuit is configured to connect each of the connecting lines via a respective first MOSFET of a first group of MOSFETs to the positive feed line and via a respective second MOSFET of a second group of MOSFETs to the negative feed line; wherein with respect to the direct current voltage vehicle electrical system, the MOSFETs of the first group and of the second group are arranged with their parasitic diodes in a reverse direction, and wherein the connection between the electric controller and the motor control unit comprises a current mirror arrangement according to any one of the aforementioned features for duplex bidirectional communication.

In a preferred embodiment safety relays are switched via the connection between the electric controller and the motor control unit, wherein one respective safety relay is located between each phase line and the Y connection.

Figure 2:
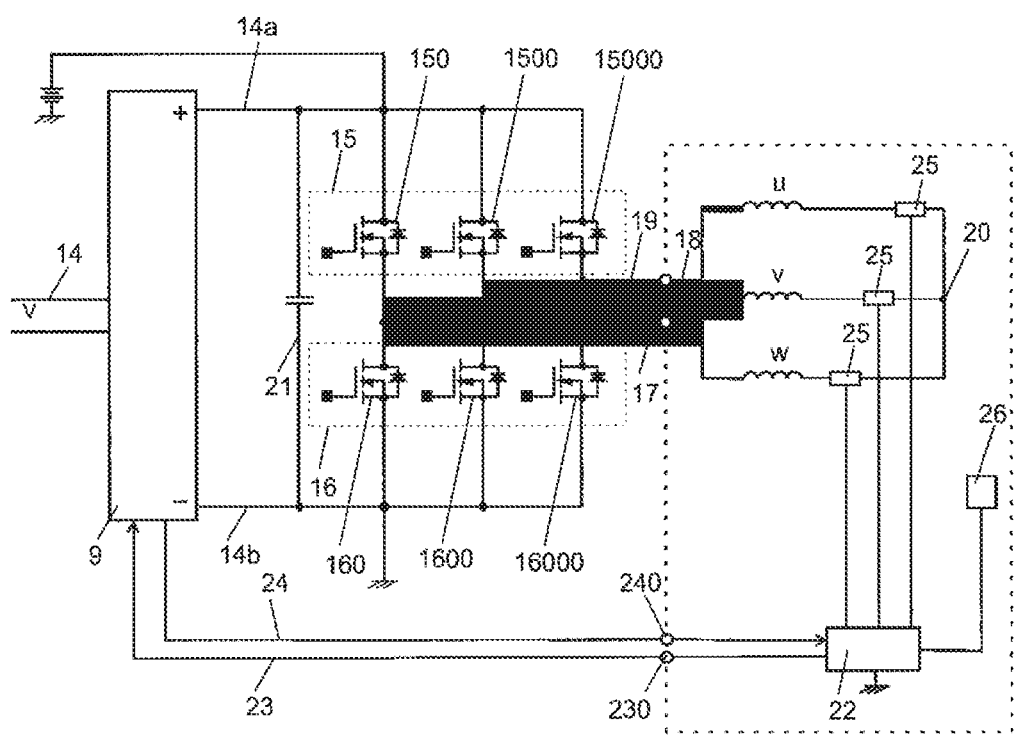
FIG. 2 is a circuit diagram of a prior art circuit for actuating a permanently excited synchronous motor.

In FIG. 1 an electromechanical power steering mechanism 1 is schematically illustrated with a steering shaft 2 connected to a steering wheel 3 for operation by the driver. Steering rack rods 4 are connected in a known way to steered wheels 5 of the motor vehicle. A rotation of the steering shaft 2 causes an axial displacement of a steering rack 6 by means of a gear pinion 7 which is connected to the steering shaft 2 in a torque-proof manner. The electromechanical power steering mechanism 1 has a motor housing 8 on the steering column side. The motor housing 8 is connected to a control unit 9 which, amongst other signals, receives torque signals form a torque sensor 10 via a signal line 11 and sends corresponding control signals via signal line 12 to the servomotor 13 arranged in the housing 8. The control unit 9 itself receives input signals, such as the vehicle speed, via a supply line 14. The servomotor 13 is a permanently excited synchronous motor. The control unit 9 is constructed as an inverter with regard to actuating the phase windings of the servomotor 13. This circuit is illustrated in more detail in FIG. 2. This design is known from prior art.

The supply line 14a is connected to the positive pole of the supply line 14 and the supply line 14b is connected to the negative pole of the supply line 14 or to the earth connection of the on-board electrical system of the motor vehicle which functions in the normal manner using direct current with negative earth. A first group 15 comprises three MOSFETs 150, 1500, 15000 for supplying the three phase windings u, v and w with the on-board vehicle power-supply voltage. A second group 16 of in total three MOSFETs 160, 1600, 16000 is provided for applying the earth potential to the phase windings u, v and w. For this purpose the two groups feed the three lines 17, 18, 19. The phase windings u, v and w are connected to one another at a neutral point 20 in a star point of the motor. Between the two supply lines 14a and 14b a smoothing capacitor 21 is also provided which suppresses high-frequency feedback effects from the motor control unit (MCU) 22 and the MOSFETs arranged in front of it.

The two groups 15 and 16 of MOSFETs are actuated via the control unit 9 and the control lines 23, 24. The MOSFETs of the first group 15 and second group 16 are provided as drivers. These driver MOSFETs are connected in such a way that their parasitic diodes are connected in the reverse direction with respect to the on-board vehicle power supply voltage. As a function of the control signals, they connect the individual phase windings either to the positive potential or to the earth potential. This takes place at high frequency, so that in the individual windings u, v, and w the temporal average value is effective as the operating voltage for producing an assistance torque.

As safety switches neutral point relays 25 are provided for each phase winding u, v, w.

The control lines 23, 24 are used to transfer information about the safety switches and measured signals, for example angle of rotation of the motor measured by a RPS sensor 26 and/or phase currents and/or motor temperature, between MCU 22 and the control unit 9. Thereby a separate line 23, 24 is required for each signal direction. Each signal line 23, 24 requires in each case a contact 230, 240 for signal transmission.

Figure 3:
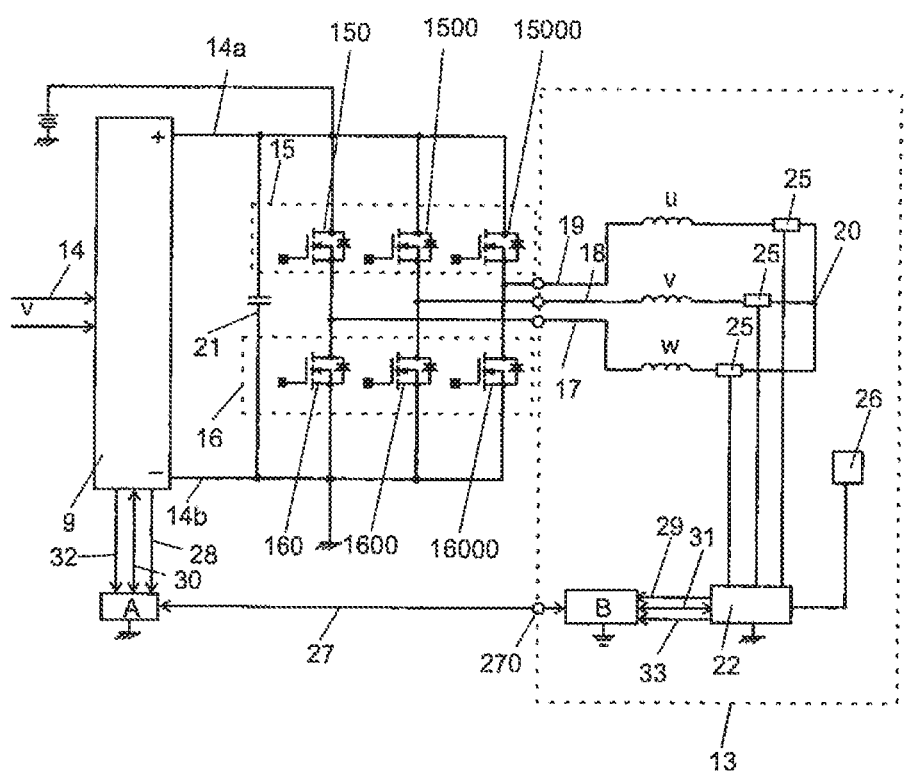
FIG. 3 is a circuit diagram of an example circuit for actuating a permanently excited synchronous motor with bidirectional communication between an ECU and an MCU of an electric motor.

FIG. 3 shows an embodiment of the present invention. The circuit is essentially identical with the circuit shown in FIG. 2, except for the control lines between the MCU 22 and the control unit 9.

The MCU 22 and the control unit 9 are connected via two circuit units A and B with a single bidirectional communication line 27 with a single contact 270, whereas the circuit units A, B determine the direction of signal transmission. The communication is half-duplex (in both direction but only one at a time). Each circuit unit A, B receives over a signal line 28, 29 directional information. Over signal lines 30, 31 the signal is transmitted and signal 5 lines 32, 33 carry the power supply. The circuit unit A with the signal lines 28, 30, 32 is arranged outside of the motor located on the side of the control unit 9. The circuit unit B with the signal lines 29, 31, 33 is arranged inside the motor 13.

Measured signals as for example the angle of rotation of the motor measured by the RPS sensor 26, and/or phase currents and/or motor temperature and/or the error signal for separation of the phase lines in the neutral point 20 of the motor are transmitted over the communication line 27 between MCU and ECU.

Figure 4:
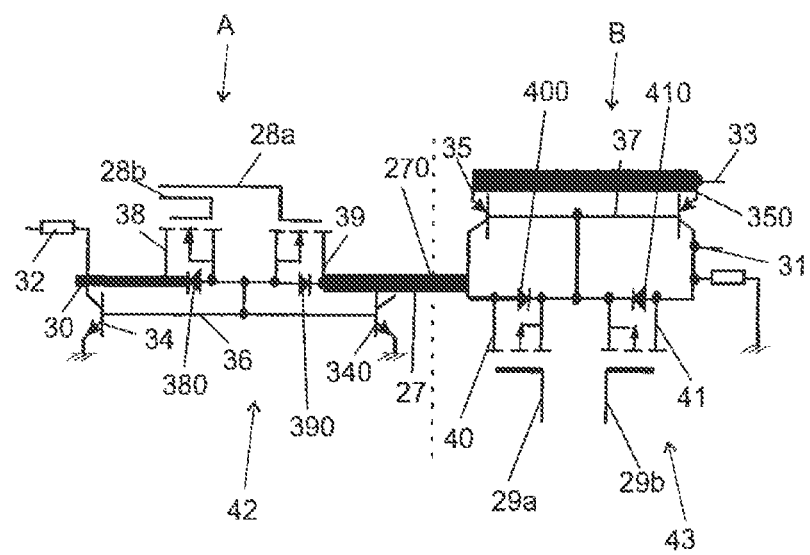
FIG. 4 is a schematic view of example circuit units that allow bidirectional signal transmission.

FIG. 4 shows the schematic illustration of the circuit units A and B, which allow bidirectional signal transmission over the communication line 27. Each circuit unit A and B comprises two identical bipolar junction transistors (BJT) 34, 340, 35, 350, whereas the BJTs 34, 340 of circuit unit A are npn-transistors and the BJTS 35, 350 of circuit unit B are pnp-transistors. The two transistors 34, 340, 35, 350 of each respective circuit unit A and B have their bases 36, 37 connected together. Further, the two transistors 34, 340, 35, 350 of each respective circuit unit A and B have their base 36, 37 and collector connected together each via a MOSFET 38, 39, 40, 41 creating a current mirror 42, 43. Current mirrors are circuits that copy or mirror the current flowing in one active device in another, keeping the output current constant regardless of loading. The two MOSFETs 38, 39 of circuit unit A are connected together with their source terminals with their parasitic diodes 380, 390 facing back-to-back. They are n-channel enhancement-mode MOSFETs. The two MOSFETs 40, 41 of circuit unit B are connected together with their source terminals with their parasitic diodes 400, 410 facing face-to-face. They are p-channel enhancement-mode MOSFETs. The MOSFETs 38, 39, 40, 41 and their parasitic diodes 380, 390, 400, 410 are arranged in a unit. The MOSFETs integrated in the current mirrors can switch the communication direction. If on the one hand the MOSFETs 39 and 40 are set to conductive, a signal is transmitted from circuit unit A to circuit unit B counter clockwise in + direction. If on the other hand the MOSFETs 38 and 41 are set to conductive, a signal is transmitted from circuit unit B to circuit unit A clockwise in – direction. The circuit units A and B are connected in a single contact 270.

The present invention provides a simple and cost effective solution for transmission of electrical signals, whereas two-sided communication can be realised with only one contact between the motor and the ECU. Bidirectional current mirrors on both sides of communication interface make it possible to use one wire for both communication directions. A regular current mirror is reversed by using additional transistors to change circuit topology by controllably reconfiguring the direction of the mirror. Level shifting is possible to account for potential differences.

The present invention is not dependent on the specific design of the steering mechanism.

What is claimed is:

1. A current mirror arrangement for bidirectional communication over a single communication line between two circuit units, wherein the current mirror arrangement is reversible and comprises in each of the two circuit units:
   a pair of first identical transistors, wherein bases of the pair of first identical transistors are connected; and
   a pair of second transistors, wherein the base and a collector of each transistor of the pair of first identical transistors are connected via one of the pair of second transistors,
wherein the pair of second transistors of each of the two circuit units are connected, wherein parasitic diodes of the pair of second transistors of each of the two circuit units are disposed in series in opposite polarity directions.

2. The current mirror arrangement of claim 1 wherein each of the two circuit units comprises a pair of MOSFETs.

3. The current mirror arrangement of claim 2 wherein the pair of MOSFETs in a first of the two circuit units comprises n-channel enhancement-mode MOSFETs, wherein the pair of MOSFETs in a second of the two circuit units comprises p-channel enhancement-mode MOSFETs.

4. The current mirror arrangement of claim 1 wherein each transistor of the pair of second transistors in each of the two circuit units is a MOSFET.

5. The current mirror arrangement of claim 4 wherein the pair of MOSFETs in a first of the two circuit units comprises n-channel enhancement-mode MOSFETs, wherein the pair of MOSFETs in a second of the two circuit units comprises p-channel enhancement-mode MOSFETs.

6. The current mirror arrangement of claim 1 wherein emitters of the pair of first identical transistors in a first of the two circuit units are connected to a ground, wherein emitters of the pair of first identical transistors in a second of the two circuit units are connected to a power line.

7. The current mirror arrangement of claim 6 wherein the pair of first identical transistors in the first of the two circuit units are npn-transistors, wherein the pair of first identical transistors in the second of the two circuit units are pnp-transistors.

8. An electromechanical motor vehicle power steering mechanism comprising:
   an electric motor including at least three phase windings connected to each other in a Y connection and a motor control unit;
   an electronic controller electronically connected to the motor control unit of the electric motor, wherein a connection between the electronic controller and the motor control unit of the electric motor comprises a current mirror arrangement for duplex bidirectional communication between the electronic controller and the motor control unit of the electric motor, which current mirror arrangement is reversible and comprises in each of two circuit units connected by a single communication line
      a pair of first identical transistors, wherein bases of the pair of first identical transistors are connected, and
      a pair of second transistors, wherein the base and a collector of each transistor of the pair of first identical transistors are connected via one of the pair of second transistors,
      wherein the pair of second transistors of each of the two circuit units are connected, wherein parasitic diodes of the pair of second transistors of each of the two circuit units are disposed in opposite directions;
   a positive feed line and a negative feed line from a direct current voltage motor vehicle electrical system and electronically coupled to the electronic controller; and
   a driver circuit coupled via respective connecting lines to the at least three phase windings of the electric motor, wherein the driver circuit is configured to connect each of the connecting lines via a respective first MOSFET of a first group of MOSFETs to the positive feed line and via a respective second MOSFET of a second group of MOSFETs to the negative feed line, wherein with respect to the direct current voltage motor vehicle electrical system parasitic diodes of the MOSFETs of the first and second groups of MOSFETs are arranged in a reverse direction.

9. The electromechanical motor vehicle power steering mechanism of claim 8 wherein safety relays are switched via the connection between the electronic controller and the motor control unit of the electric motor, wherein the safety relays are located between the at least three phase windings and the Y connection.

10. The current mirror arrangement of claim 8 wherein each of the two circuits comprises a pair of MOSFETs.

11. The current mirror arrangement of claim 10 wherein the pair of MOSFETs in a first of the two circuits comprises n-channel enhancement-mode MOSFETs, wherein the pair of MOSFETs in a second of the two circuits comprises p-channel enhancement-mode MOSFETs.

12. The current mirror arrangement of claim 8 wherein each transistor of the pair of second transistors in each of the two circuits is a MOSFET.

13. The current mirror arrangement of claim 12 wherein the pair of MOSFETs in a first of the two circuits comprises n-channel enhancement-mode MOSFETs, wherein the pair of MOSFETs in a second of the two circuits comprises p-channel enhancement-mode MOSFETs.

14. The current mirror arrangement of claim 8 wherein emitters of the pair of first identical transistors in a first of the two circuits are connected to a ground, wherein emitters of the pair of first identical transistors in a second of the two circuits are connected to a power line.

15. The current mirror arrangement of claim 14 wherein the pair of first identical transistors in a first of the two circuits are npn-transistors, wherein the pair of first identical transistors in a second of the two circuits are pnp-transistors.

* * * * *